United States Patent
Huang et al.

(10) Patent No.: US 8,050,040 B2
(45) Date of Patent: Nov. 1, 2011

(54) FLEXIBLE PRINTED CIRCUIT BOARD WITH IMPROVED REINFORCING STRUCTURE

(75) Inventors: Che-Hung Huang, Jungli (TW); Cheng-Fu Chang, Sinjhuang (TW)

(73) Assignee: HTC Corporation, Taoyuan County (TW)

( * ) Notice: Subject to any disclaimer, the term of this patent is extended or adjusted under 35 U.S.C. 154(b) by 804 days.

(21) Appl. No.: 11/078,226

(22) Filed: Mar. 9, 2005

(65) Prior Publication Data
US 2006/0148312 A1    Jul. 6, 2006

(30) Foreign Application Priority Data
Jan. 3, 2005 (TW) ................................ 94200021 U

(51) Int. Cl.
*H05K 1/00* (2006.01)
(52) U.S. Cl. .................... 361/749; 361/826; 361/748
(58) Field of Classification Search .............. 361/749, 361/414, 600, 679.01, 679.55, 679.56, 748, 361/826; 385/92; 174/68.5, 68.1, 250, 254; 439/257, 55, 65, 67, 77, 296, 492–496
See application file for complete search history.

(56) References Cited

U.S. PATENT DOCUMENTS

| | | | | |
|---|---|---|---|---|
| 3,676,746 | A | * | 7/1972 | Kassabgi et al. ............. 361/749 |
| 4,735,847 | A | * | 4/1988 | Fujiwara et al. ............. 428/209 |
| 4,845,313 | A | * | 7/1989 | Endoh et al. .................. 174/261 |
| 5,168,430 | A | * | 12/1992 | Nitsch et al. .................. 361/749 |
| 5,911,597 | A | * | 6/1999 | Oshitani ........................ 439/495 |
| 6,195,260 | B1 | * | 2/2001 | Moriyama .................... 361/749 |
| 7,128,596 | B2 | * | 10/2006 | Masaki et al. ................ 439/492 |
| 7,374,435 | B2 | * | 5/2008 | Idenishi ........................... 439/77 |
| 2004/0047570 | A1 | * | 3/2004 | Lo et al. ........................... 385/92 |
| 2010/0202119 | A1 | * | 8/2010 | Nagami et al. ................ 361/749 |

* cited by examiner

*Primary Examiner* — Hung S Bui
(74) *Attorney, Agent, or Firm* — J.C. Patents

(57) ABSTRACT

A flexible printed circuit (FPC) board includes a flexible substrate, an electric terminal portion, and a reinforcing structure. The electric terminal portion is disposed on a bottom surface of the flexible substrate and is suitable to be inserted into an electrical connector to electrically connect therewith. The reinforcing structure is disposed on a top surface of the flexible substrate and located just above the electric terminal portion. The reinforcing portion includes a stiffener plate bonded to the top surface of the flexible substrate and a pad bonded to a top surface of the stiffener plate. The pad is shorter than the stiffener plate.

16 Claims, 2 Drawing Sheets

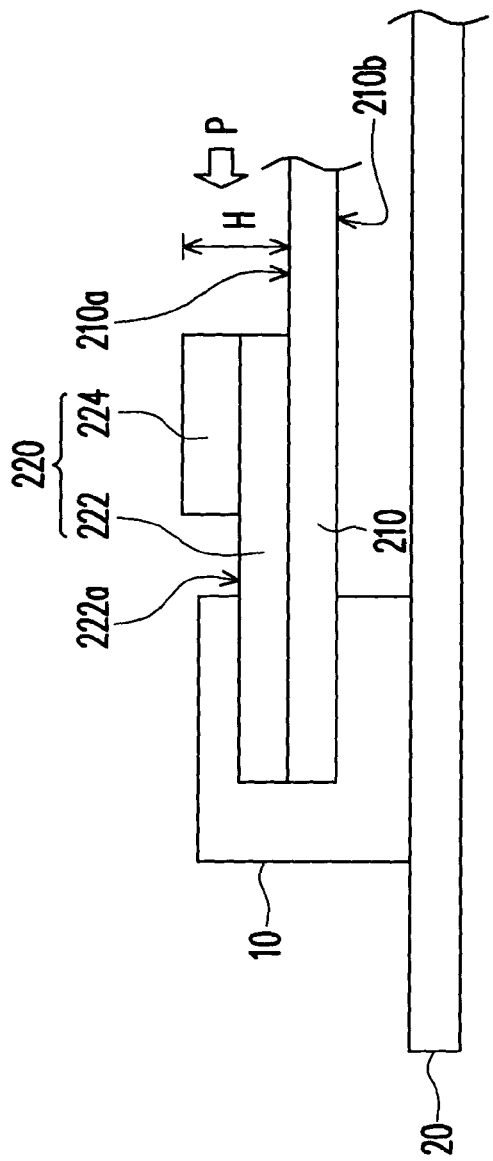
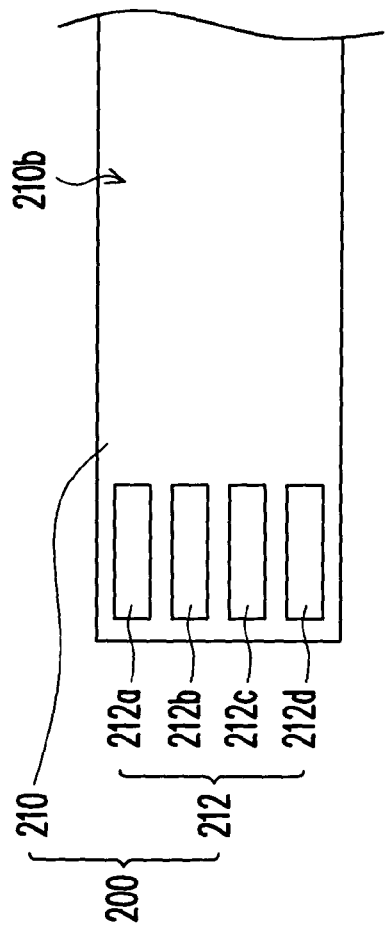
FIG. 2A
FIG. 2B

FLEXIBLE PRINTED CIRCUIT BOARD WITH IMPROVED REINFORCING STRUCTURE

CROSS-REFERENCE TO RELATED APPLICATION

This application claims the priority benefit of Taiwan application serial no. 94200021, filed on Jan. 3, 2005.

BACKGROUND OF THE INVENTION

1. Field of the Invention

The present invention relates to a flexible printed circuit board, and more particularly to a flexible printed circuit board having an improved reinforcing structure.

2. Description of the Related Art

In today's information society, various electronic products are increasingly used in daily activities. To meet the market demands for high-speed, high-efficiency and small-sized electronic products, flexible printed circuit (FPC) boards have been used in various electronic devices, such as notebooks, cell phones, digital cameras, personal digital assistants (PDAs), printers, and optical disk drives. In these various electronic devices, the FPC boards are mainly used as means for connecting two electronic circuits distant from each other, wherein one of the electronic circuits includes an electrical connector for electrically connecting with the FPC board. In some applications, in order to be more space efficient, the FPC boards are even bonded with IC chips thereon.

Please refer to FIG. 1A, an assembly of a conventional FPC board 100, an electrical connector 10 and a printed circuit board (PCB) 20 is shown. FIG. 1B is a schematic bottom view of the FPC board 100 of FIG. 1A.

Referring to FIGS. 1A and 1B, the conventional FPC board 100 is inserted into the electrical connector 10. The electrical connector 10 is electrically connected to the printed circuit board 20; thus, signals can be transmitted between the conventional FPC board 100 and the printed circuit board 20 via an electric terminal portion 112 of the conventional FPC board 100 and the electrical connector 10.

The FPC board 100 includes a flexible substrate 110 and the electric terminal portion 112 disposed on a bottom surface 110b of a front end of the flexible substrate 110. Since the flexible substrate 100 is made of flexible material, a reinforcing structure 120 is required to be applied to the flexible substrate 100 at a position corresponding to the electric terminal portion 112 whereby the electrical terminal portion 112 can be correctly inserted into the electrical connector 10 to electrically connect therewith. Here, the reinforcing structure 120 is disposed on a top surface 110a of the front end of the flexible substrate 110. When the front end of the flexible substrate 110 is inserted into the electrical connector 10, the electric terminal portion 112 (shown in FIG. 1B) disposed on the bottom surface 110b of the flexible substrate 110 electrically engages with a electric terminal portion (not shown) of the electrical connector 10 which is soldered to the printed circuit board 20.

It is noticed that a thickness T of the reinforcing structure 120 is often limited under structural consideration, which in turn results that the reinforcing structure 120 can not have a thickness large enough to provide sufficient rigidity required for the front end of the FPC board 100. A sufficient rigidity is required to ensure that the front end of the FPC board 100 can be smoothly inserted into the electrical connector 10 without occurrence of warpage. Furthermore, for a small thickness T, a rear edge of the reinforcing structure 120 has a small surface area, which is a place for a user's fingers to exert a force to push the front end of the FPC board 100 into the electrical connector 10. For a small surface area of the rear edge of the reinforcing structure 120, the user is not convenient to exert the pushing force. Finally, there is no place on the FPC board 100 which can facilitate the user to conveniently pull the FPC board 100 away from the electrical connector 10 when the front end of the FPC board 100 is required to be separated from the electrical connector 10

SUMMARY OF THE INVENTION

Accordingly, the present invention is directed to provide an improved reinforcing structure for an FPC board wherein the improved reinforcing structure can enhance rigidity of a front end of the FPC board.

The present invention is also directed to provide an improved reinforcing structure for an FPC board wherein the improved reinforcing structure has a rear edge with a large surface area so that a user of the FPC board can easily exert a pushing force to the FPC board to insert the FPC board into an electrical connector.

The present invention is also directed to provide an improved reinforcing structure for an FPC board wherein the improved reinforcing structure can facilitate a user of the FPC board to exert force to the FPC board to separate the FPC board from an electrical connector.

According to an embodiment of the present invention, the present invention provides an improved reinforcing structure suitable to be disposed on an FPC board. The FPC board includes a flexible substrate and an electric terminal portion, wherein the electric terminal portion is disposed on a bottom surface of a front end of the flexible substrate. The reinforcing structure includes a stiffener plate and a pad, wherein the stiffener plate is disposed on a top surface of the front end of the flexible substrate, and the pad is disposed on a top face of a rear portion of the stiffener plate.

The improved reinforcing structure according to the present invention is made of an insulating material, such as plastics, hard rubber, or acrylic fiber. A rear edge of the pad is aligned with a rear edge of the stiffener plate so that a rear edge of the improved reinforcing structure can be enlarged to facilitate a user's finger to push the improved reinforcing structure and therefore the front end of the FPC board into an electrical connector.

A configuration is formed between the stiffener plate and the pad. When the front end of the FPC board is inserted into the electrical connector, the step is spaced from the electrical connector a distance. To separate the FPC board from the electrical connector, a user can use his (her) finger or a tool to exert a rearward force to a front edge of the pad thereby pulling the front end of the FPC board away from the electrical connector. The provision of the pad over the stiffener not only facilitates the user's operation to insert/separate the FPC board into/away from the electrical connector, but also increases the rigidity of the front end of the FPC board, whereby the insertion of the FPC board into the electrical connector can be more smoothly preceded.

It is to be understood that both the foregoing general description and the following detailed description are exemplary, and are intended to provide further explanation of the invention as claimed.

BRIEF DESCRIPTION OF THE DRAWINGS

FIG. 2A is a schematic side view showing an assembly of an FPC board in accordance with the present invention, an electrical connector and a printed circuit board.

FIG. 2B is a schematic bottom view of the FPC board of FIG. 2A.

DESCRIPTION OF THE PREFERRED EMBODIMENT

Figure 1A:
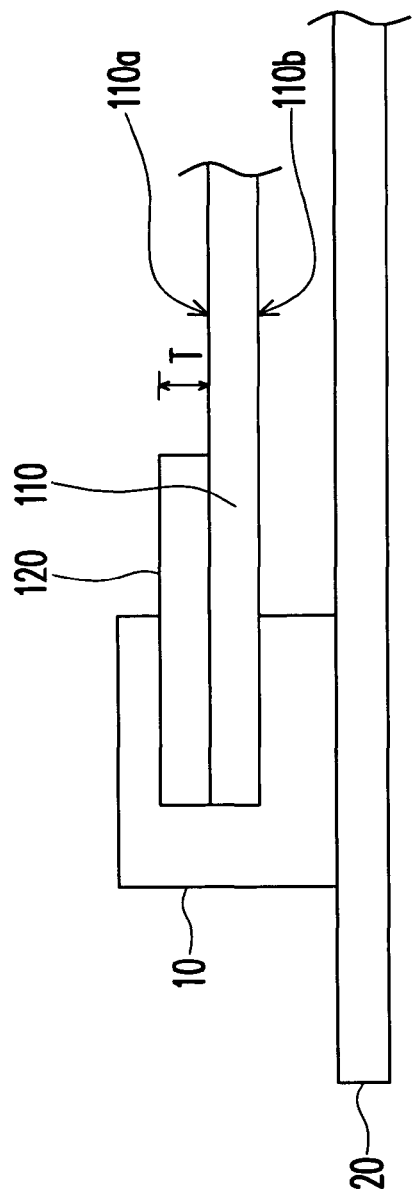
FIG. 1A is a schematic side view showing an assembly of a conventional FPC board, an electrical connector and a printed circuit board.
Figure 1B:
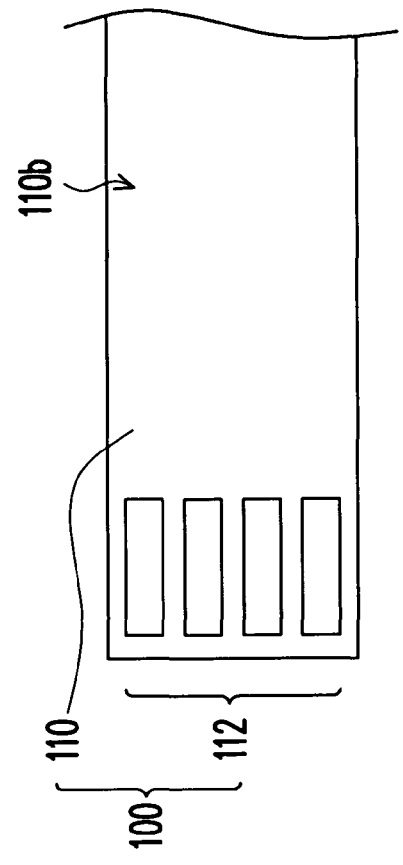
FIG. 1B is a schematic bottom view of the FPC board of FIG. 1A.

FIGS. 2A and 2B are respectively a side view of a flexible printed circuit (FPC) board 200 in accordance with the present invention inserted in an electrical connector 10 and a bottom view of the FPC board 200 of FIG. 2A.

Referring to FIGS. 2A and 2B, the FPC board 200 having a reinforcing structure 220 is inserted into the electrical connector 10 soldered to a printed circuit board 20, and, thus, signals can be transmitted between the FPC board 200 and the printed circuit board 20 via the electrical connector 10.

Since the FPC board 200 is mainly made of a flexible substrate 210, a rigid reinforcing structure 220 is required to stiffen a front end of the FPC board 200 so that the front end of the FPC board 200 can be smoothly inserted into the electrical connector 10 without occurrence of warpage.

In addition to the reinforcing structure 220 and the flexible substrate 210, the FPC board 200 includes an electric terminal portion 212 positioned on a bottom surface of the front end of the flexible substrate 210. The reinforcing structure 220 is disposed on a top surface of the front end of the FPC board, and consists of a stiffener plate 222 and a pad 224. The flexible substrate 210 is made of flexible insulating material, such as polyamide or polyester resin, and has metal wires (not shown) disposed thereon as means for power and data signal transmission. The electric terminal portion 212 is formed with the metal wires by a circuit pattern etching process. Once the front end of the FPC board 200 into the electrical connector 10, the electric terminal portion 212 of the FPC board 200 engages with an electric terminal portion (not shown) of the electrical connector 10 so that power and data signals can be transmitted from the metal wires of the FPC board 210 to the printed circuit board 20 and vice versa. In this preferred embodiment, the electric terminal portion 212 includes four conducting contacts 212a, 212b, 212c, 212d (shown in FIG. 2B). The conducting contacts 212a~212d are made of copper or other metal with high conductivity.

The stiffener plate 222 and the pad 224 are made of insulating material, such as plastics, hard rubber, or acrylic fiber. The stiffener plate 222 is disposed on a top surface 210a of the flexible substrate 210 via a process of, for example, bonding. When the front end of the FPC board 200 is inserted into the electrical connector 10, a front portion of the stiffener plate 222 is received in the electrical connector 10, while a rear portion of the stiffener plate 222 is extended rearwards beyond the electrical connector 10. The pad 224 is bonded to a top surface 222a of a part of the rear portion of the stiffener plate 222. The pad 224 has a rear edge (not labeled) aligned with a rear edge (not labeled) of the stiffener plate 222, and a front edge (not labeled) spaced from the electrical connector 10 a distance.

The reinforcing structure 220 has a height H, which is a combination of heights of the rear edges of the stiffener plate 222 and the pad 224. Such a height H in this embodiment is double the height T of the reinforcing structure 120 of the prior art of FIG. 1A. By such design, a user can easily use his (her) finger to push the rear edge of the reinforcing structure 220 along a direction P to insert the front end of the FPC board 200 into the electrical connector 20.

Of course, the height H of the rear edge of the reinforcing structure 220 can be readily increased by increasing a thickness of the pad 224.

In addition, to remove the inserted front end of the FPC board 200 from the electrical connector 20, the user can use his (her) finger or a tool to exert a rearwards pushing force on the front edge of the pad 224.

As known from the above, the present invention has at least the advantages as follows.

(1) The height and thus surface area of the rear edge of the reinforcing structure 220 is enlarged so that the user can easily use his (her) finger to push forwards the rear edge of the reinforcing structure 220 thereby inserting the front end of the FPC board 200 into the electrical connector 10.

(2) To withdraw the inserted FPC board 200 from the electrical connector 10, the user can use the front edge of the pad 224 as a place for exerting a rearwards force to the FPC board 200, whereby the operation for separating the FPC board 200 from the electrical connector 10 can be easily achieved.

(3) The provision of the pad 224 increases the thickness of the reinforcing structure 220, in comparison with the prior art, whereby the rigidity of the reinforcing structure 220 is enhanced so that the possibility of warpage of the front end of the FPC board 200 can be significantly reduced when inserting the front end of the FPC board 200 into the electrical connector 10.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A reinforcing structure for a flexible printed circuit board, the flexible printed circuit board having a flexible substrate and an electric terminal portion directly disposed on a bottom surface of a front end of the flexible substrate, the electric terminal portion being used for electrically engaging with an electrical connector, the reinforcing structure being disposed on a top surface of the front end of the flexible substrate and comprising:

a stiffener plate with its bottom surface directly bonded to the top surface of the flexible substrate, wherein the stiffener plate has a portion for being inserted into the electrical connector; and a pad directly bonded to a top surface of the stiffener plate, wherein when the stiffener plate is inserted into the electrical connector, the pad is located outside the electrical connector.

2. The reinforcing structure according to claim 1, wherein the pad and the stiffener plate are made of insulating material.

3. The reinforcing structure according to claim 2, wherein the pad and the stiffener plate are made of plastics, hard rubber, or acrylic fiber.

4. The reinforcing structure according to claim 1, wherein a rear edge of the stiffener plate and a rear edge of the pad are aligned with each other.

5. The reinforcing structure according to claim 1, wherein the pad has a thickness greater than or equal to a thickness of the stiffener plate.

6. A flexible printed circuit (FPC) board comprising:

a flexible substrate having a top surface and a bottom surface;

an electric terminal portion directly disposed on the bottom surface of the flexible substrate and being adapted for electrically engaging with an electrical connector when the flexible substrate is inserted into the electrical connector; and a reinforcing structure comprising a stiffener plate with its bottom surface directly bonded to the top surface of the flexible substrate, wherein when the electric terminal portion electrically engages with the electrical connector, a front portion of the stiffener is received in the electrical connector and a rear portion of the stiffener plate is extended rearwards beyond the electrical connector, and a pad directly bonded to a top surface of the stiffener plate, wherein the stiffener plate has a portion for being inserted into the electrical connector, and when the stiffener plate is inserted into the electrical connector, the pad is located outside the electrical connector.

7. The FPC board according to claim 6, wherein the pad and the stiffener plate are made of insulating material.

8. The FPC board according to claim 7, wherein the pad and the stiffener plate are made of plastics, hard rubber, or acrylic fiber.

9. The FPC board according to claim 6, wherein a rear edge of the pad is aligned with a rear edge of the stiffener plate.

10. The FPC board according to claim 6, wherein the pad has a thickness greater than or equal to a thickness of the stiffener plate.

11. The FPC board according to claim 6, wherein the flexible substrate is made of polyamide or polyester resin.

12. The FPC board according to claim 6, wherein the electric terminal portion contains a plurality of conducting contacts.

13. An electrical assembly, comprising:
a printed circuit board;
an electrical connector electrically mounted on the printed circuit board;
a flexible printed circuit (FPC) board inserted into the electrical connector, comprising:
a flexible substrate having top and bottom surfaces;
an electric terminal portion directly bonded to one of the top and bottom surfaces of the flexible substrate and electrically engaging with the electrical connector; and
a reinforcing structure bonded to the other of the top and bottom surfaces of the flexible substrate, inserted into the electrical connector, wherein the reinforcing structure includes a stiffener plate with its bottom surface directly bonded to the flexible substrate, and a pad directly bonded to the stiffener plate, the stiffener plate having a portion inserted into the electrical connector and the pad being located outside the electrical connector.

14. The electrical assembly according to claim 13, wherein the stiffener plate has a rear edge aligned with a rear edge of the pad.

15. The electrical assembly according to claim 14, wherein the flexible substrate is made of polyamide or polyester resin.

16. The electrical assembly according to claim 15, wherein the reinforcing structure is made of plastics, hard rubber or acrylic fiber.

* * * * *